(12) United States Patent
Yamazaki et al.

(10) Patent No.: US 6,489,764 B2
(45) Date of Patent: Dec. 3, 2002

(54) MR METHOD AND APPARATUS FOR MAKING BROADER THE 180° EXCITATION WIDTH

(75) Inventors: Aki Yamazaki, Tokyo (JP); Yoshikazu Ikezaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 16 days.

(21) Appl. No.: 09/779,291

(22) Filed: Feb. 8, 2001

(65) Prior Publication Data

US 2001/0021795 A1 Sep. 13, 2001

(30) Foreign Application Priority Data

Mar. 10, 2000 (JP) ........................................ 2000-067313

(51) Int. Cl.[7] ................................................ G01V 3/00
(52) U.S. Cl. ...................................... 324/307; 324/309
(58) Field of Search ................................. 324/307, 309

(56) References Cited

U.S. PATENT DOCUMENTS

| 4,573,015 | A | * | 2/1986 | Abe et al. ..................... 324/309 |
| 4,803,432 | A | * | 2/1989 | Perman ....................... 324/307 |
| 6,147,490 | A | * | 11/2000 | Watanabe .................... 324/307 |
| 6,166,541 | A | * | 12/2000 | Smith et al. ................. 324/300 |
| 6,188,219 | B1 | * | 2/2001 | Reeder et al. .............. 324/307 |
| 6,265,872 | B1 | * | 7/2001 | Heid .......................... 324/307 |
| 6,304,084 | B1 | * | 10/2001 | Star-Lack et al. ........... 324/307 |

* cited by examiner

Primary Examiner—Edward Lefkowitz
Assistant Examiner—Dixomara Vargas
(74) Attorney, Agent, or Firm—Moonray Kojima

(57) ABSTRACT

To preventing a deterioration in NMR signals due to a slice-leaned state, in executing a pulse sequence by the spin echo method, the inclination angle G2 of the slice gradient at the time of applying a 180° RF pulse P is made smaller than the inclination angle G1 of the slice gradient at the time of applying a 90° RF pulse R.

12 Claims, 8 Drawing Sheets

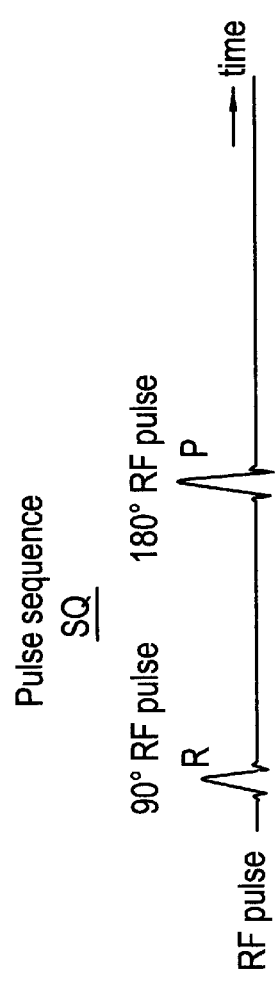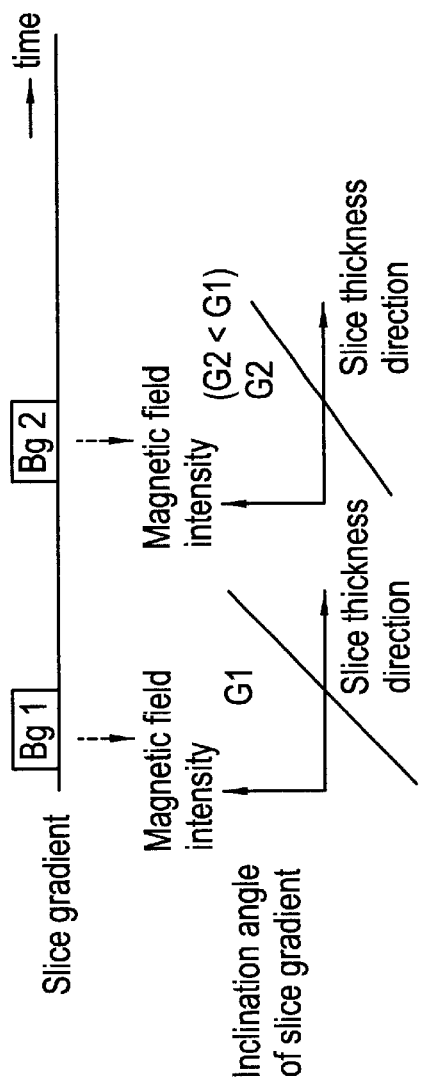

Sp ; Additional excitation width
SL ; Slice thickness

Sp ; Additional excitation width
SL ; Slice thickness

Pulse sequence
SQ1

Pulse sequence SQ2

MR METHOD AND APPARATUS FOR MAKING BROADER THE 180° EXCITATION WIDTH

BACKGROUND OF THE INVENTION

The present invention relates to an MR (magnetic resonance) imaging method and an MRI (magnetic resonance imaging) apparatus, and more particularly to an MR imaging method and an MRI apparatus preventing deterioration in NMR (nuclear magnetic resonance) signals due to a slice-leaned state.

FIG. 1 is a drawing illustrating an example of pulse sequence SQ' by a conventional spin echo (SE) method.

As shown in FIG. 1(a), first a 90° RF pulse R for exciting a desired slice is applied to effect excitation, and then a 180° RF pulse P for exciting the same slice is applied to invert the slice. Then, as shown in FIG. 1(b), a spin echo signal E51 is observed.

As shown in FIG. 1(c), when applying the aforementioned 90° RF pulse R and when applying the aforementioned 180° RF pulse P, a slice gradient Bg1 where the magnetic field intensity with respect to the position in the slice thickness direction varies at the rate of the inclination angle G1 is added.

As shown in FIG. 2(a), a profile Ar pertaining to the aforementioned 90° RF pulse R takes on a shape relatively close to the ideal rectangular waveform indicated by dotted lines. On the other hand a profile Ap51 pertaining to the aforementioned 180° RF pulse P takes on a shape whose two shoulders are rounded unlike the ideal rectangular form indicated by dotted lines. Incidentally, the half power width of each profile is supposed to be the excitation width τ.

Therefore, as shown in FIG. 2(b), the slice profile F' determined by the product of the aforementioned profile Ar and the aforementioned profile AP51 takes on a rounded shape with both shoulders gently sloped, generating a so-called "slice-leaned" state.

However, if the aforementioned slice-leaned state arises, there will arise the problem that no NMR signal is obtained in the shadowed area U between the profile and the ideal rectangular form indicated by the dotted lines, resulting in a deterioration in the quality of MR images.

SUMMARY OF THE INVENTION

An object of the present invention is to provide an MR imaging method and an MRI apparatus preventing deterioration in NMR signals due to a slice-leaned state.

In its first aspect, the invention provides an MR imaging method for applying a 180° RF pulse to a specimen after applying a 90° RF pulse to it, characterized in that the excitation width pertaining to the aforementioned 180° RF pulse is made broader than the excitation width pertaining to the aforementioned 90° RF pulse.

According to the MR imaging method in the aforementioned first aspect, since the excitation width pertaining to the 180° RF pulse is made broader than the excitation width pertaining to the 90° RF pulse, the width of the profile pertaining to the 180° RF pulse is expanded in the slice thickness direction.

As a result, it is made possible to restrain the slice profile from falling into a slice-leaned state and thereby to prevent NMR signals from deterioration.

As the slice thickness pertaining to the slice profile is restricted by the profile pertaining to the 90° RF pulse, it will not expand excessively.

In its second aspect, the invention provides an MR imaging method of the above-described configuration, characterized in that the excitation width is expanded by making the inclination angle of the gradient magnetic field with respect to the position in the slice thickness direction at the time of applying the 180° RF pulse smaller than the inclination angle of the gradient magnetic field at the time of applying the 90° RF pulse.

According to the MR imaging method in the aforementioned second aspect, there is no need to alter the 180° RF pulse because the excitation width is expanded by making the inclination angle of the gradient magnetic field smaller at the time of applying the 180° RF pulse. This is particularly useful where widening of the band of the RF pulse frequency component is restricted.

In its third aspect, the invention provides an MR imaging method of the above-described configuration, characterized in that the excitation width is expanded by reducing the width of the aforementioned 180° RF pulse in the time axis direction.

According to the MR imaging method in the aforementioned third aspect, the excitation width can be expanded even where the inclination angle of the gradient magnetic field with respect to the position in the slice thickness direction at the time of applying the 180° RF pulse is equal to the inclination angle of the gradient magnetic field at the time of applying the 90° RF pulse, because the frequency component band is made broader by reducing the width of the 180° RF pulse in the time axis direction to expand the excitation width. Where it is to be used in combination with a reduction in the inclination angle of the gradient magnetic field at the time of applying the 180° RF pulse, the difference from the inclination angle of the gradient magnetic field at the time of applying the 90° RF pulse, and the control of the gradient magnetic field can be made easier and more precisely.

In its fourth aspect, the invention provides an MR imaging method of the above-described configuration, characterized in that, where multi-slice imaging is to be accomplished by successively applying a plurality of 180° RF pulses, the excitation width pertaining to the aforementioned 180° RF pulse is made broader than the excitation width pertaining to the aforementioned 90° RF pulse by not smaller than a 0.4-fold multiple but not greater than a 0.6-fold multiple of the slice spacing.

According to the MR imaging method in the aforementioned fourth aspect, the NMR signal intensity improving performance due to expansion of the excitation width can be sufficiently achieved because the lower limit of expanding the excitation width pertaining to the 180° RF pulse is made a 0.4-fold multiple of the slice spacing. Furthermore, as the upper limit of expanding the excitation width pertaining to the 180° RF pulse is made a 0.6-fold multiple of the slice spacing, interference between adjoining slice profiles can be reduced.

As a result, even where multi-slice imaging is to be carried out, it is possible to prevent NMR signals from deterioration by restraining the occurrence of a slice-leaned state.

In its fifth aspect, the invention provides an MR imaging method of the above-described configuration, characterized in that the excitation width pertaining to an inversion pulse to be applied first out of a pulse sequence is made broader than the excitation width pertaining to the 90° RF pulse.

According to the MR imaging method in the aforementioned fifth aspect, even where a pulse sequence of an inversion recovery (IR) method, by which an inversion pulse which inverts the direction of the nuclear magnetization vector by 180° is applied at the beginning of the sequence, NMR signals can be prevented from deterioration by restraining the occurrence of a slice-leaned state.

In its sixth aspect, the invention provides an MR imaging method of the above-described configuration, characterized in that the excitation width of the aforementioned 180° RF pulse is expanded so that the whole part excited by the aforementioned 90° RF pulse be excited by the aforementioned 180° RF pulse.

According to the MR imaging method in the aforementioned sixth aspect, the best SNR can be obtained.

In its seventh aspect, the invention provides an MRI apparatus provided with a gradient magnetic field generating unit for generating a gradient magnetic field; an RF pulse transmitting unit for transmitting RF pulses; and an NMR signal receiving unit for receiving NMR signals; and the MRI apparatus being characterized in that it is provided with an excitation width adjusting unit for making the excitation width pertaining to a 180° RF pulse broader than the excitation width pertaining to a 90° RF pulse.

The MRI apparatus in the aforementioned seventh aspect can appropriately implement the MR imaging method according to the aforementioned first aspect.

In its eighth aspect, the invention provides an MRI apparatus of the above-described configuration, characterized in that the aforementioned excitation width adjusting unit so controls the operation of the aforementioned gradient magnetic field generating unit as to make the inclination angle of the gradient magnetic field with respect to the position in the slice thickness direction at the time of applying the 180° RF pulse smaller than the inclination angle of the gradient magnetic field at the time of applying the 90° RF pulse.

The MRI apparatus in the aforementioned eighth aspect can appropriately implement the MR imaging method according to the aforementioned second aspect.

In its ninth aspect, the invention provides an MRI apparatus of the above-described configuration, characterized in that the aforementioned excitation width adjusting unit so controls the operation of the aforementioned RF pulse transmitting unit as to reduce the width of the aforementioned 180° RF pulse in the time axis direction.

The MRI apparatus in the aforementioned ninth aspect can appropriately implement the MR imaging method according to the aforementioned third aspect.

In its 10th aspect, the invention provides an MRI apparatus of the above-described configuration, characterized in that the aforementioned excitation width adjusting unit, where multi-slice imaging is to be accomplished by successively applying a plurality of 180° RF pulses, makes the excitation width pertaining to the aforementioned 180° RF pulse broader than the excitation width pertaining to the aforementioned 90° RF pulse by not smaller than a 0.4-fold multiple but not greater than a 0.6-fold multiple of the slice spacing.

The MRI apparatus in the aforementioned 10th aspect can appropriately implement the MR imaging method according to the aforementioned fourth aspect.

In its 11th aspect, the invention provides an MRI apparatus of the above-described configuration, characterized in that the aforementioned excitation width adjusting unit makes the excitation width pertaining to an inversion pulse to be applied first out of a pulse sequence broader than the excitation width pertaining to the 90° RF pulse.

The MRI apparatus in the aforementioned 11th aspect can appropriately implement the MR imaging method according to the aforementioned fifth aspect.

In its 12th aspect, the invention provides an MRI apparatus of the above-described configuration, characterized in that the aforementioned excitation width adjusting unit expands the excitation width of the aforementioned 180° RF pulse so that the whole part excited by the aforementioned 90° RF pulse be excited by the aforementioned 180° RF pulse.

The MRI apparatus in the aforementioned 12th aspect can appropriately implement the MR imaging method according to the aforementioned sixth aspect.

Therefore, The MR imaging method and the MRI apparatus according to the present invention makes it possible to obtain a slice profile closed to the ideal rectangular form and to generate MR images of high picture quality by, after exciting a prescribed excitation width with a 90° RF pulse, exciting a broader range than the excitation width with a 180° RF pulse.

Further objects and advantages of the present invention will be apparent from the following description of the preferred embodiments of the invention as illustrated in the accompanying drawings.

BRIEF DESCRIPTION OF THE DRAWINGS

FIG. 4 is a diagram for explaining a pulse sequence of a spin echo method by the MRI apparatus 100 of FIG. 3.

DETAILED DESCRIPTION OF THE INVENTION

Figure 1A:
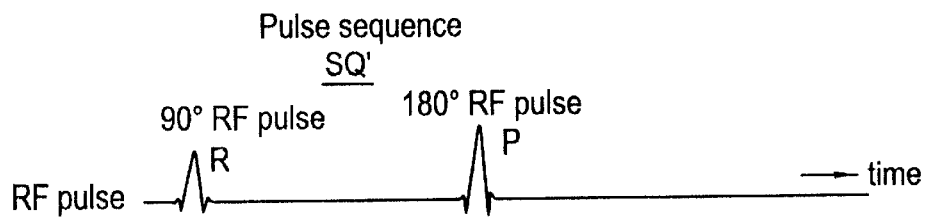
FIG. 1 are diagrams for explaining a pulse sequence by a spin echo method according to the prior art.
Figure 1B:
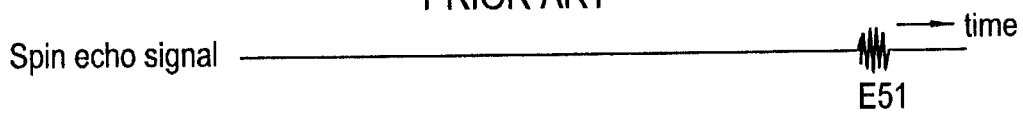
Figure 1C:
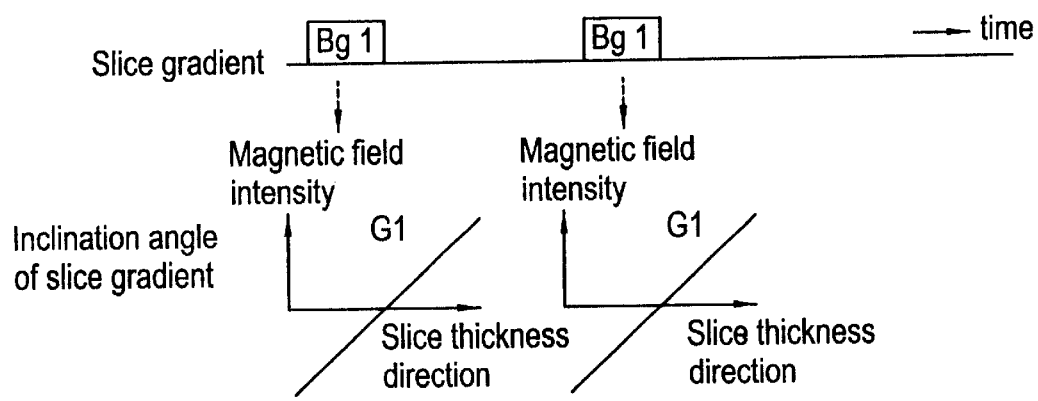

The present invention will be described in further detail below with reference to modes of its implementation illustrated in the drawings.

Figure 3:
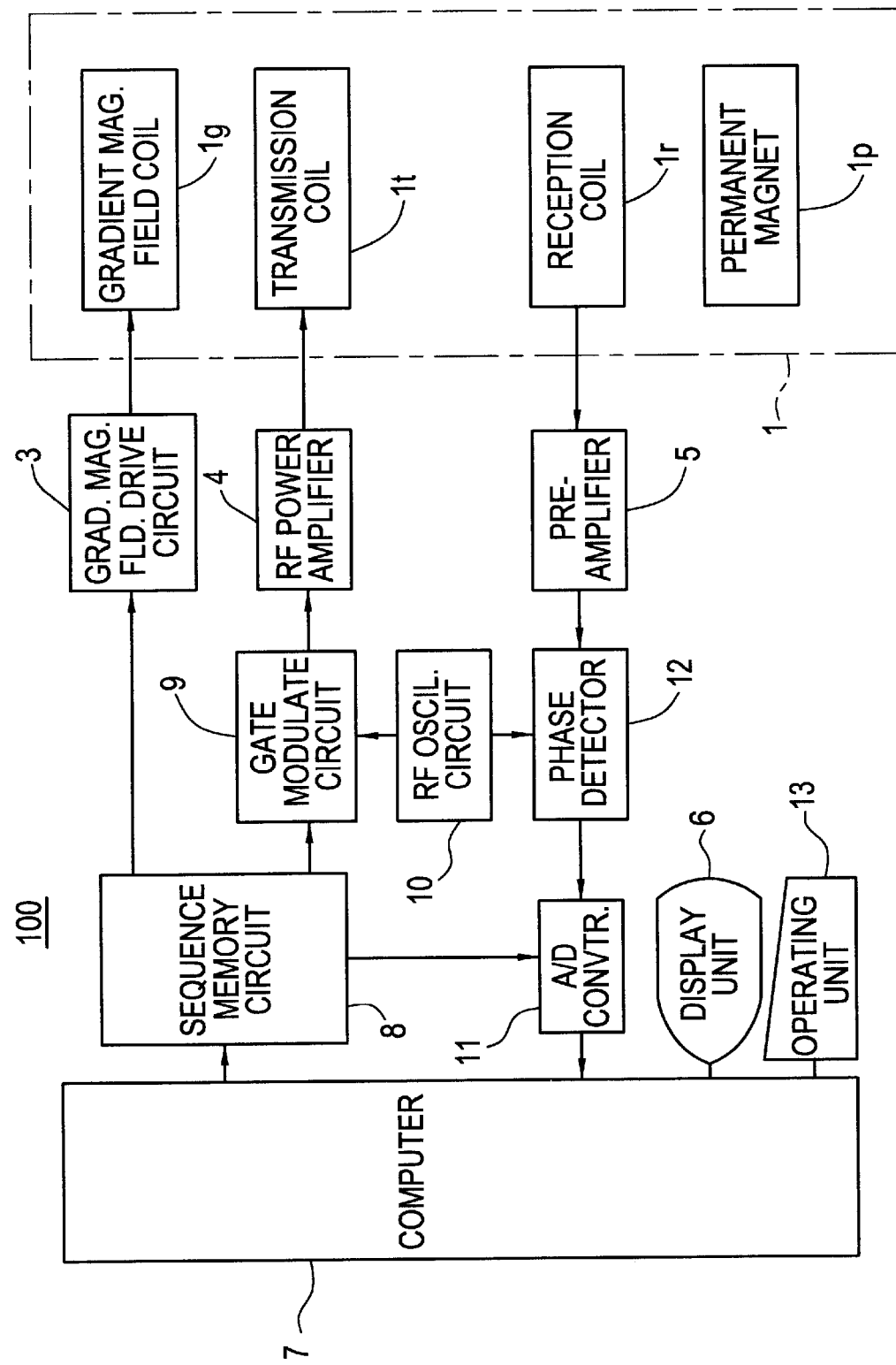
FIG. 3 is a block diagram of an MRI apparatus in one embodiment of the invention.

FIG. 3 is a block diagram of an MRI apparatus in one mode of implementing the invention.

In this MRI apparatus 100, a magnet assembly 1 has a space part (hole) for inserting a specimen into the inside, and surrounding this space part there are arranged a permanent magnet 1p for applying a static magnetic field of a certain intensity Ho to the specimen; a gradient magnetic field coil 1g for applying gradient pulses to a slice gradient shaft, a phase gradient shaft and a read gradient shaft; a transmission coil 1t for providing an RF pulse to excite the spinning of atomic nuclei in the specimen; and a reception coil 1r for detecting NMR signals from the specimen. The aforementioned gradient magnetic field coil 1g, transmission coil 1t and reception coil 1r are respectively connected to a gradient magnetic field drive circuit 3, an RF power amplifier 4 and a preamplifier 5.

Incidentally, instead of the aforementioned permanent magnet, a superconducting magnet or a normally conducting magnet may be used as well.

A sequence memory circuit 8, in accordance with an instruction a computer 7, operates the gradient magnetic field drive circuit 3 on the basis of a pulse sequence that is stored to apply a gradient pulse from the gradient magnetic field coil 1g of the aforementioned magnet assembly 1, and at the same time operates a gate modulation circuit 9 to modulate carrier output signals of an RF oscillation circuit 10 into pulse-shaped signals of a prescribed timing and a prescribed envelope shape. These signals are applied to the RF power amplifier 4 as RF pulses, and after being amplified in power by the RF power amplifier 4, applied to the transmission coil 1t of the aforementioned magnet assembly 1 to excite a desired slice area.

The preamplifier 5 amplifies NMR signals out of the specimen detected by the reception coil 1r of the magnet assembly 1, and inputs them to a phase detector 12. The phase detector 12, with the carrier output signals from the RF oscillation circuit 10 as reference signals, phase-detects the NMR signals from the preamplifier 5, and provides them to an A/D converter 11. The A/D converter 11 converts phase-detected analog signals into digital signals, and inputs them to the computer 7.

The computer 7 reads data from the A/D converter 11, and subjects them to computation for image reconfiguration to generate an image of the desired slide area. This image is displayed on a display unit 6. The computer 7 is responsible for overall control, including acceptance of information inputted from an operating unit 13.

FIG. 4 is a diagram for explaining a pulse sequence SQ of a spin echo method by the MRI apparatus 100 of FIG. 3.

As shown in FIG. 4(a), first, excitation is accomplished by applying a 90° RF pulse R for exciting a desired slice, and then it is inverted by applying a 180° RF pulse P for exciting the aforementioned desired slice. Then, as shown in FIG. 4(b), a spin echo signal E is observed.

As shown in FIG. 4(c), when the aforementioned 90° RF pulse R is applied, a slice gradient Bg1 where the magnetic field intensity with respect to the position in the slice thickness direction varies at the rate of an inclination angle G1 is added. Or when the aforementioned 180° RF pulse P is applied, a slice gradient Bg2 where the magnetic field intensity with respect to the position in the slice thickness direction varies at the rate of an inclination angle G2 (G2<G1) is added.

Figure 2A:
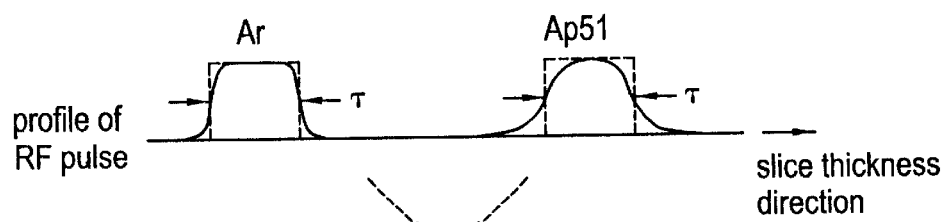
FIG. 2 are diagrams for explaining the principle of generation of a slice-leaned state due to the pulse sequence of FIG. 1.
Figure 2B:
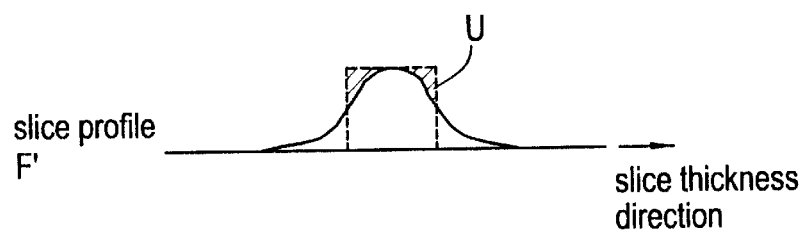
Figures 5A, 5B:
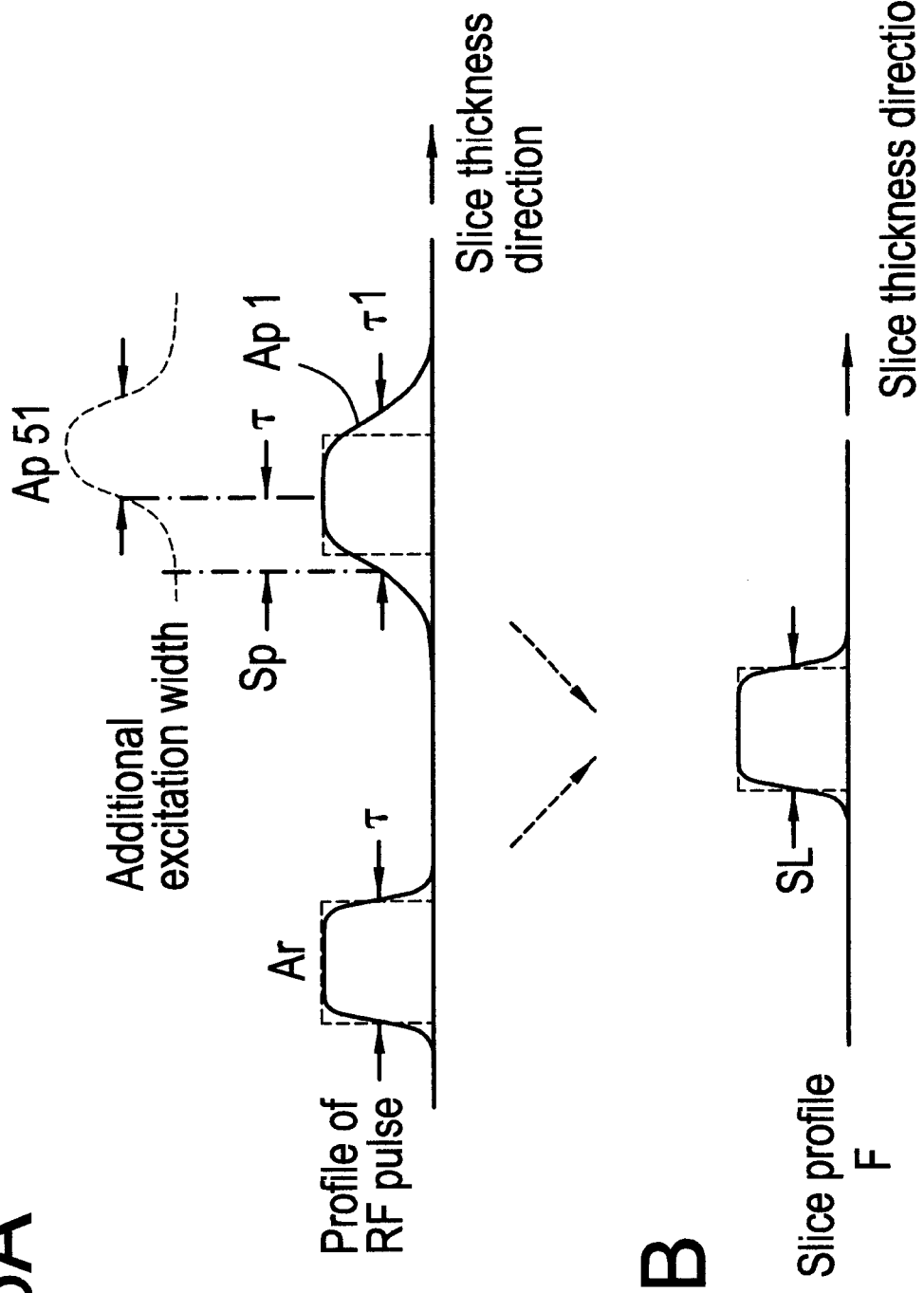
FIG. 5 are diagrams for explaining the profile and the slice profile pertaining to the RF pulse of the pulse sequence of FIG. 4.

As shown in FIG. 5(a), a profile AP1 pertaining to the aforementioned 180° RF pulse P is broader than the profile AP51 pertaining to the conventional pulse sequence SQ' (see FIG. 2) in the slice thickness direction. Thus, the excitation width τ1 is broader than the excitation width τ pertaining to the aforementioned profile Ap51 by an additional excitation width Sp.

Therefore, as shown in FIG. 5(b), it is made possible restrain the slice profile F from falling into a slice-leaned state and thereby prevent the spin echo signal E from dropping in intensity. To add, the slice thickness SL pertaining to the slice profile F does not expand excessively as it is limited by the aforementioned profile Ap1.

Figure 6:
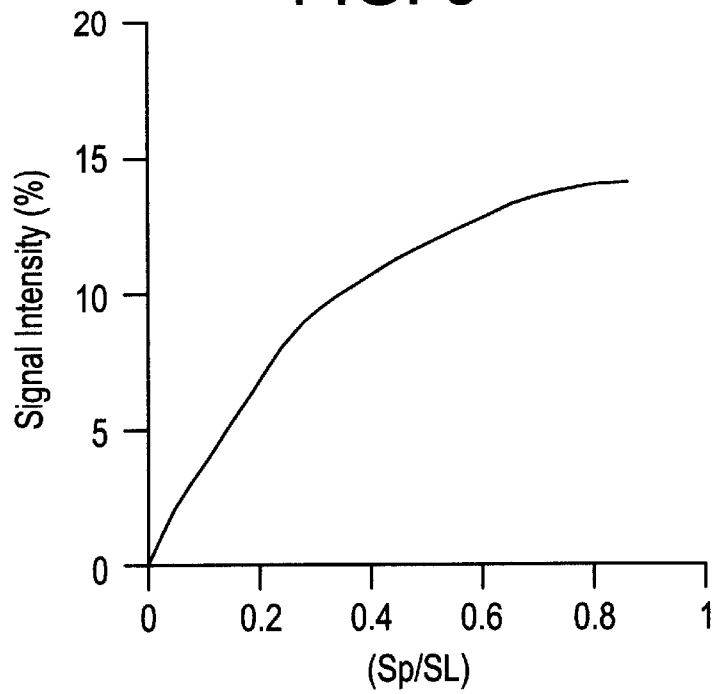
FIG. 6 is a graph typically showing variations in signal intensity when single-slice imaging is performed.

FIG. 6 is a graph typically showing variations in the intensity of the spin echo signal E (a standardized percentage with the signal intensity at an additional excitation width SP of 0 being the reference) relative to [the additional excitation width Sp/the slice thickness SL] when single-slice imaging is performed with the pulse sequence SQ of FIG. 4.

Figure 7:
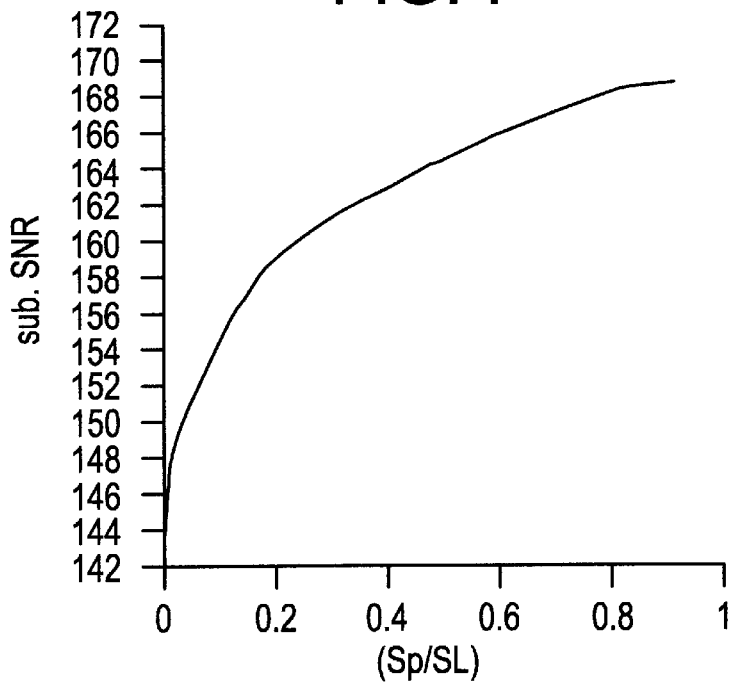
FIG. 7 is a graph typically showing variations in sub.SNR when single-slice imaging is performed.

FIG. 7 is a graph typically showing variations in sub.SNR (SNR obtained, after observing the spin echo signal E twice, from its dispersion and signal intensity) relative to the aforementioned [Sp/SL]. The slice thickness SL is 5 [mm]. The echo time TE is the minfull (the minimum TE that can be set without fractional echo). The repeat time TR is 500 ms.

The aforementioned signal intensity and the aforementioned sub.SNR become greater with an increase in the aforementioned [Sp/SL].

Figure 8A:
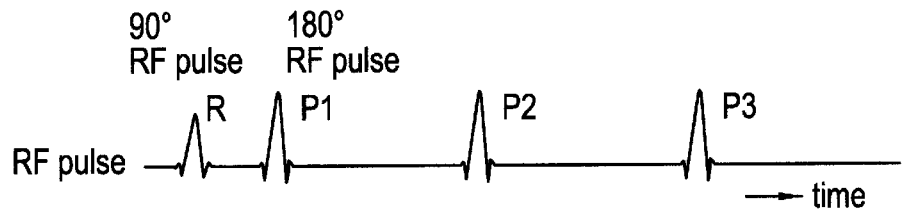
FIG. 8 are diagrams for explaining a pulse sequence SQ1 when multi-slice imaging is performed with the MRI apparatus 100 of FIG. 3.
Figure 8B:
Figure 8C:
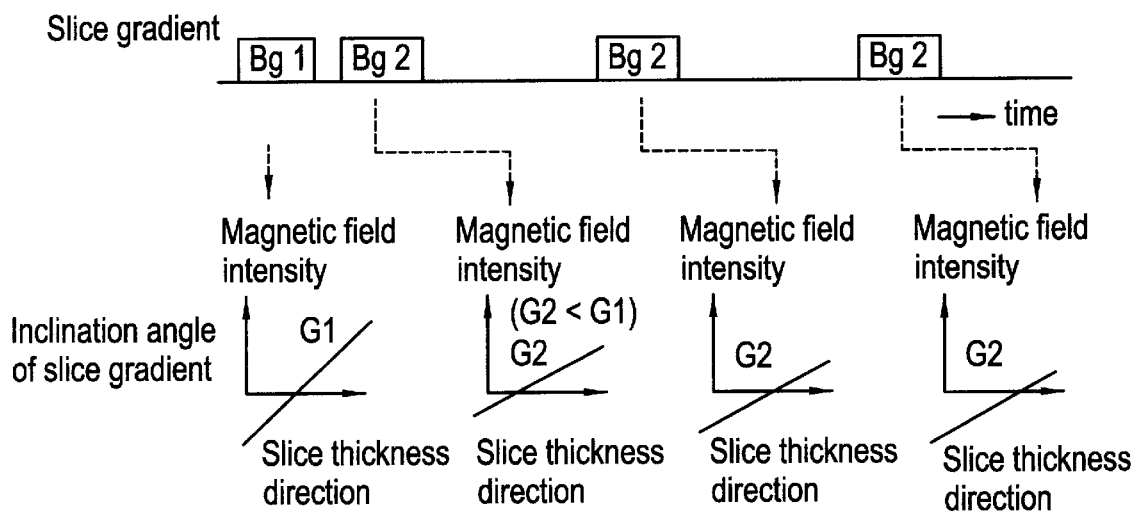

FIG. 8 consists of diagrams for explaining a pulse sequence SQ1 when multi-slice imaging is with the MRI apparatus 100 of FIG. 3.

After applying a 90° RF pulse at the beginning of the sequence, a plurality of 180° RF pulses P1, P2, P3, . . . are successively applied, and then echo signals E1, E2, E3, . . . are observed.

At the time of applying the aforementioned 90° RF pulse R, the slice gradient Bg1 where the magnetic field intensity with respect to the position in the slice thickness direction varies at the rate of the inclination angle G1 is added. Or when the aforementioned 180° RF pulses P1, P2, P3, . . . are applied, the slice gradient Bg2 where the magnetic field intensity with respect to the position in the slice thickness direction varies at the rate of the inclination angle G2 (G2<G2) is added. To add, in order to shift the slice position, it is necessary to vary the D.C. component of the slice gradient Bg2 slightly for each of the 180° RF pulses P1, P2, P3, . . .

Figure 9:
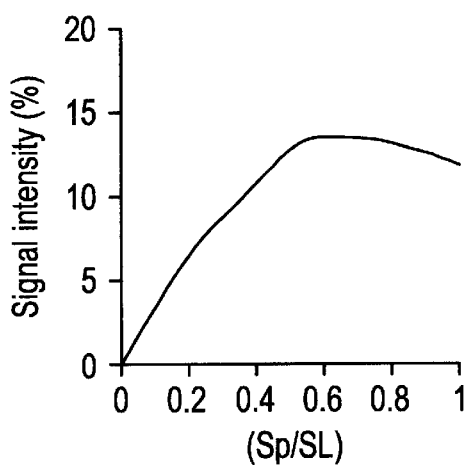
FIG. 9 is a graph typically showing variations in signal intensity when multi-slice imaging is performed.

FIG. 9 is a graph typically showing variations in the intensity of echo signals relative to [the additional excitation width SP/the slice thickness SL] when multi-slice imaging is performed with the pulse sequence SQ1 of FIG. 8. The slice thickness SL is 5 [mm]. The slice spacing is 5 [mm]. The echo time TE is minfull. The repeat time TR is 500 ms.

The aforementioned signal intensity is particularly satisfactorily improved when the aforementioned [SP/SL] is not less than 0.4 but not more than 0.6 (10% to well over 10% better than when SP=0). Thus, when the aforementioned [Sp/SL] is less than 0.4, the quantity of width expansion of the profile pertaining to the 180° RF pulses P1, P2, P3, . . . is relatively small and insufficient for restraining a slice-leaned state. Or when the aforementioned [SP/SL] is greater than 0.6, interference occurs between adjoining slice profiles under the influence of the ripple component of each slice profile.

With the MRI apparatus 100 so far described, a deterioration in spin echo signals due to a slice-leaned state can be prevented, making it possible to generate and display MR images of high quality.

To add, the above-described MRI apparatus 100 may as well be modified as follows.

(1) Also where a plurality of 180° RF pulses are successively applied after applying the 90° RF pulse and at the same time a pulse sequence by a fast spin echo (FSE) method by which the gradient magnetic field in the phase encoding direction is to be varied for each echo signal is to be executed, the present invention can be applied by expanding the excitation width pertaining to the aforementioned 180° RF pulses. In this case, for the first echo signal which is observed immediately after the first 180° RF pulse, since it is a spin echo, satisfactory signal intensity improving performance can be achieved by expanding the excitation width pertaining to the 180° RF pulse. By contrast, for the second and subsequent echo signals, since they have stimulated echo contents, the signal intensity improving performance is somewhat inferior. To cite examples in numerical terms, while about 10% signal intensity improving performance is achieved for the first echo signal, only about 5% signal intensity improving performance is achieved for the third echo signal.

Figure 10A:
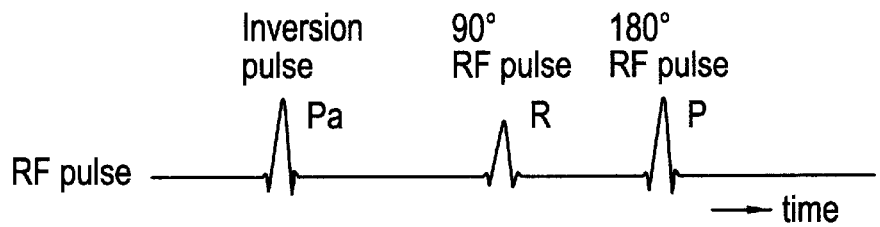
FIG. 10 are diagrams for explaining a pulse sequence by an inversion recovery method in another embodiment of the invention.
Figure 10B:
Figure 10C:
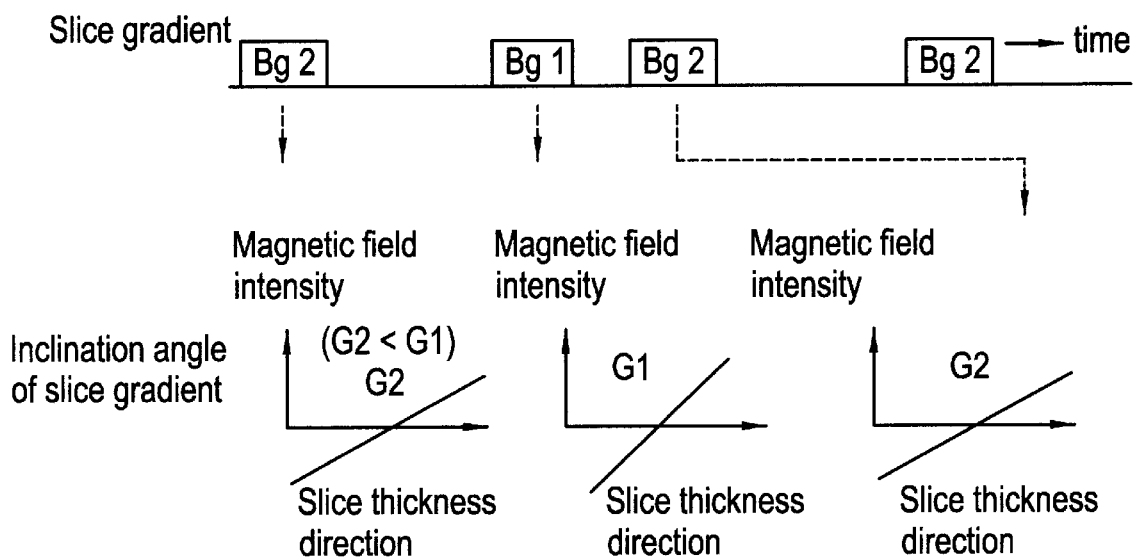

(2) As illustrated in FIG. 10, the invention can be applied even where a pulse sequence by an inversion recovery (IR) method is to be executed, by making the inclination angle G2 of the slice gradient at the time of applying an inversion pulse Pa in a pulse sequence SQ2 smaller than the inclination angle G1 of the slice gradient at the time of applying the 90° RF pulse R.

Figure 11:
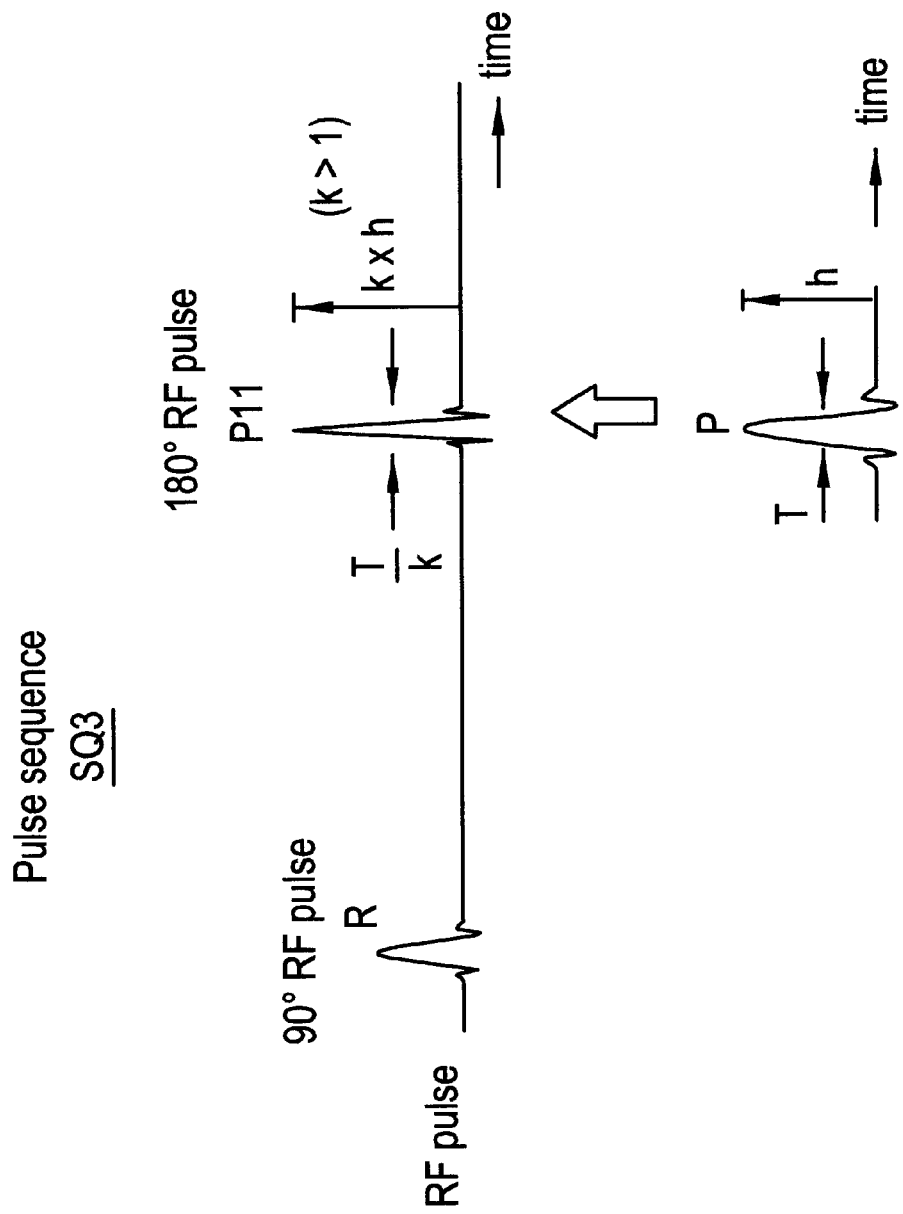
FIG. 11 are diagrams for explaining a pulse sequence by a spin echo method in still another still another embodiment of the invention.

(3) Instead of, or in addition to, making the inclination angle G2 of the slice gradient at the time of applying an inversion pulse Pa smaller than the inclination angle G1 of the slice gradient at the time of applying the 90° RF pulse R (see FIG. 4), as represented by a pulse sequence SQ3 in FIG. 11, a 180° RF pulse P11 of which the half power width of the 180° RF pulse P is reduced to 1/k (k>1) and the amplitude is expanded by k can be applied as well. This enables the frequency component of the aforementioned 180° RF pulse P11 to be expanded to a wide band and the excitation width pertaining to the 180° RF pulse P11 can be enlarged.

Many widely different embodiments of the invention may be configured without departing from the spirit and the scope of the present invention. It should be understood that the present invention is not limited to the specific embodiments described in the specification, except as defined in the appended claims.

We claim:

1. An MR imaging method comprising the steps of:
    applying a 90° RF pulse to a specimen;
    applying a first gradient magnetic field at time of applying said 90° RF pulse;
    applying a 180° RF pulse to said specimen; and
    applying a second gradient magnetic field at time of applying said 180° RF pulse;
    wherein an inclination angle of said second gradient magnetic field with respect to a position in a slice thickness direction at time of applying said 180° RF pulse is smaller than an inclination angle of said first gradient magnetic field with respect to a position in a slice thickness direction at time of applying said 90° RF pulse, whereby a resulting excitation profile avoids falling into a slice-leaned state and prevents NMR signals from becoming deteriorated.

2. The method of claim 1, wherein multi-slice imaging is accomplished by successively applying a plurality of 180° RF pulses and successively applying a plurality of second gradient magnetic fields having gradually smaller inclination angles.

3. The method of claim 2, wherein said resulting excitation profile of the excitation width of the 180° RF pulses and the accompanying corresponding gradient magnetic fields is broader than the resulting excitation width of the 90° RF pulse and accompanying corresponding gradient magnetic field within a range which is not smaller than 0.4 fold multiple and not greater than 0.6 fold multiple in slice spacing.

4. The method of claim 1, wherein an inversion pulse is applied prior to said 90° RF pulse and an accompanying gradient magnetic field is applied at an inclination angle which is smaller than the inclination angle of the gradient magnetic field applied at time of the 90° RF pulse, so that the resulting excitation profile has a broader excitation width than that pertaining to the 90° RF pulse and its accompanying gradient magnetic field.

5. The method of claim 1, wherein the resulting excitation profile has an excitation width of the 180° RF pulse which is expanded so that a whole part excited by the 90° RF pulse is excited by said 180° RF pulse.

6. The method of claim 1, wherein the resulting excitation profile has an excitation width which is expanded by reducing the width of the 180° RF pulse.

7. An MRI apparatus comprising:
    means for applying a 90° RF pulse to a specimen;
    means for applying a first gradient magnetic field at time of applying said 90° RF pulse;
    means for applying a 180° RF pulse to said specimen;
    means for applying a second gradient magnetic field at time of applying said 180° RF pulse;
    means for receiving NMR signals from said specimen; and
    control means for controlling said means for applying said first gradient magnetic field and said means for applying said second gradient magnetic field so that an inclination angle of said gradient magnetic field with respect to a position in a slice thickness direction at time of applying said 180° RF pulse is smaller than an inclination angle of said first gradient magnetic field with respect to a position in a slice thickness direction at time of applying said 90° RF pulse, whereby a resulting excitation profile avoids falling into a slice-leaned state and prevents NMR signals from becoming deteriorated.

8. The apparatus of claim 7, further comprising means for applying a plurality of 180° RF pulses, and means for applying a plurality of second gradient magnetic fields and wherein said control means control said means for applying a plurality of second gradient magnetic fields so that the plurality of second gradient magnetic fields have gradually smaller inclination angles.

9. The apparatus of claim 8, wherein said control means controls said means for applying the first gradient magnetic field and said means for applying the plurality of second gradient magnetic fields so that the resulting excitation profile of the excitation width of the 180° RF pulses and the accompanying corresponding gradient magnetic fields is broader than the resulting excitation width of the 90° RF pulse and accompany corresponding gradient magnetic field within a range which is not smaller than 0.4 fold multiple and not greater than 0.6 fold multiple in slice spacing.

10. The appratus of claim 7 further comprising means for applying an inversion pulse prior to said 90° RF pulse, and means for applying another gradient magnetic field at an inclination angle which is smaller than the inclination angle of the gradient magnetic field applied at time of the 90° RF pulse, so that the resulting excitation profile has a broader excitation width than that pertaining to the 90° RF pulse and its accompanying gradient magnetic field.

11. The apparatus of claim 7, wherein said control means comprises means for causing said means for applying said first gradient magnetic field and said means for applying said second gradient magnetic field to expand the excitation profile so that the excitation width of the 180° RF pulse and accompanying gradient magnetic field excites a whole part excited by said 90° RF pulse.

12. The apparatus of claim 7, wherein said control means comprises means for causing said means for applying said first gradient magnetic field and said means for applying said second gradient magnetic field to expand the excitation profile by reducing the width of the 180° RF pulse.

* * * * *